United States Patent [19]

Ely

[11] Patent Number: 4,646,331
[45] Date of Patent: Feb. 24, 1987

[54] ELECTRONIC STATIC SWITCHED-LATCH FREQUENCY DIVIDER CIRCUIT WITH ODD NUMBER COUNTING CAPABILITY

[75] Inventor: Glenn L. Ely, San Jose, Calif.

[73] Assignee: Intersil, Inc., Cupertino, Calif.

[21] Appl. No.: 718,171

[22] Filed: Apr. 1, 1985

[51] Int. Cl.$^4$ ............................................. H03K 21/00
[52] U.S. Cl. ...................................... 377/47; 377/115; 377/121; 307/529
[58] Field of Search .................. 377/47, 48, 118, 121; 307/279, 272 A, 529

[56] References Cited

U.S. PATENT DOCUMENTS

| | | | |
|---|---|---|---|
| 3,829,713 | 8/1974 | Canning | 307/225 C |
| 3,930,169 | 12/1975 | Kuhn, Jr. | 307/279 |
| 4,100,429 | 7/1978 | Adachi | 307/279 |
| 4,181,862 | 1/1980 | Dingwall | 307/279 |
| 4,484,087 | 11/1984 | Mazin et al. | 377/68 |
| 4,495,628 | 1/1985 | Zasio | 307/272 A |
| 4,495,629 | 1/1985 | Zasio et al. | 307/272 A |
| 4,569,067 | 2/1986 | Gallup | 307/272 A |

Primary Examiner—Stanley D. Miller
Assistant Examiner—Karl Ohralik
Attorney, Agent, or Firm—Stanley C. Corwin; Mark Mollon

[57] ABSTRACT

An electronic frequency divider circuit, particularly well-adapted to implement odd-number counters, comprising a multiplicity of switched-latch stages, and in the case of an odd-number counter, further including a bypass circuit stage. Each switched-latch stage comprises a first transmission gate and two inverters configured as a latch circuit, and a second transmission gate for coupling the latch circuit to a previous stage. Even-number divider circuits may be implemented using only pairs of switched-latch stages without the bypass circuit.

3 Claims, 2 Drawing Figures

ELECTRONIC STATIC SWITCHED-LATCH FREQUENCY DIVIDER CIRCUIT WITH ODD NUMBER COUNTING CAPABILITY

BACKGROUND OF THE INVENTION

1. Field of the Invention

This invention relates to electronic frequency divider or counter circuits, and more particularly to a static, switched-latch frequency divider circuit particularly adapted for implementation in complimentary metal oxide semiconductor technology.

2. Description of Related Art

In many instances in digital electronics, it is desirable to divide a clock frequency by N where N is an integer greater than or equal to two. Power of two divider or counter circuits are fairly well-known. Odd-number counter circuits (that is, where N is an odd-integer greater than or equal to three) are somewhat more complex circuits. Such circuits often are used in electronic watch or clock circuits.

Prior art odd-number divider circuits have often been devised from random logic out of component parts such as flip-flops and simple gate circuitry. Such circuits are not normally suitable for direct implementation as part of a large scale integrated circuit because they require a large amount of random logic to reset them at the desired odd count, and therefore do not lay out on an integrated circuit in an efficient manner.

The assignee of the present invention has previously developed a family of dividers that divide by odd numbers. One such divider is shown in FIG. 1. This divide-by-three counter uses an overdriven latch architecture. The advantages of this implementation over the discrete circuit structure of the prior art are reduced transistor counts and reduced random logic. Hence, greater layout efficiency in creating integrated circuits is achieved. However, the overdriven latch architecture shown in FIG. 1, while suitable at low frequencies and high power supply voltages, suffers from at least three limitations at high frequencies and low power supply voltage.

First, the overdriven latch architecture is relatively slow because of the time required for an inverter to drive through a transmission gate and overdrive a latch. Second, such circuits use an undesirable amount of power because the latches are forced (or "overdriven") into an opposite state. Third, such circuits require critical device ratioing to guarantee that the latches can be overdriven at all combinations of supply voltages, threshold voltages, and temperatures. The threshold voltage problem becomes acute when the power supply voltage is reduced for a low power circuit. The threshold voltage becomes a dominant factor, and to guarantee that the latches can be overdriven device ratios become unrealistic and layout efficiency is reduced for integrated circuit implementation.

The present invention eliminates the necessity for device ratioing by applying a static switched-latch principle. This divider architecture has improved speed and power characteristics over the overdriven latch scheme and is more efficient for layout purposes in fabricating integrated circuits.

It is therefore an object of the present invention to provide a new and improved static switched-latch divider circuit which is particularly well configured for implementation in an integrated circuit. It is another object of the present invention to adapt such a circuit as an odd-number divider or counter. The present invention achieves these objectives with a simple, highly regular complimentary metal oxide semiconductor (CMOS) field effect transistor (FET) circuit, described in full below.

SUMMARY OF THE INVENTION

The present invention is designed around an improved latch means, a multiplicity of which are coupled together by transfer gates, and at least one of which has a special bypass logic circuit coupled to two previous counter stages for odd-number counting. The design comprises a novel clock frequency divider circuit particularly well adapted for dividing by odd integers greater than or equal to three. The basic divide-by-three circuit described in detail below can be extended to count by any odd number by simply adding additional pairs of stages identical to the first two stages of the basic divide-by-three counter.

The basic latch circuit described herein may be used as an even number divider circuit by concatenating pairs of stages together and omitting the special bypass logic circuit. Both the even and odd divider circuit structure is extremely regular, and therefore provide for highly efficient layout in structuring integrated circuits.

DESCRIPTION OF THE DRAWINGS

The invention will become better understood by reference to the following detailed description when taken in conjunction with the accompanying drawings.

DESCRIPTION OF THE PREFERRED EMBODIMENT

Figure 1:
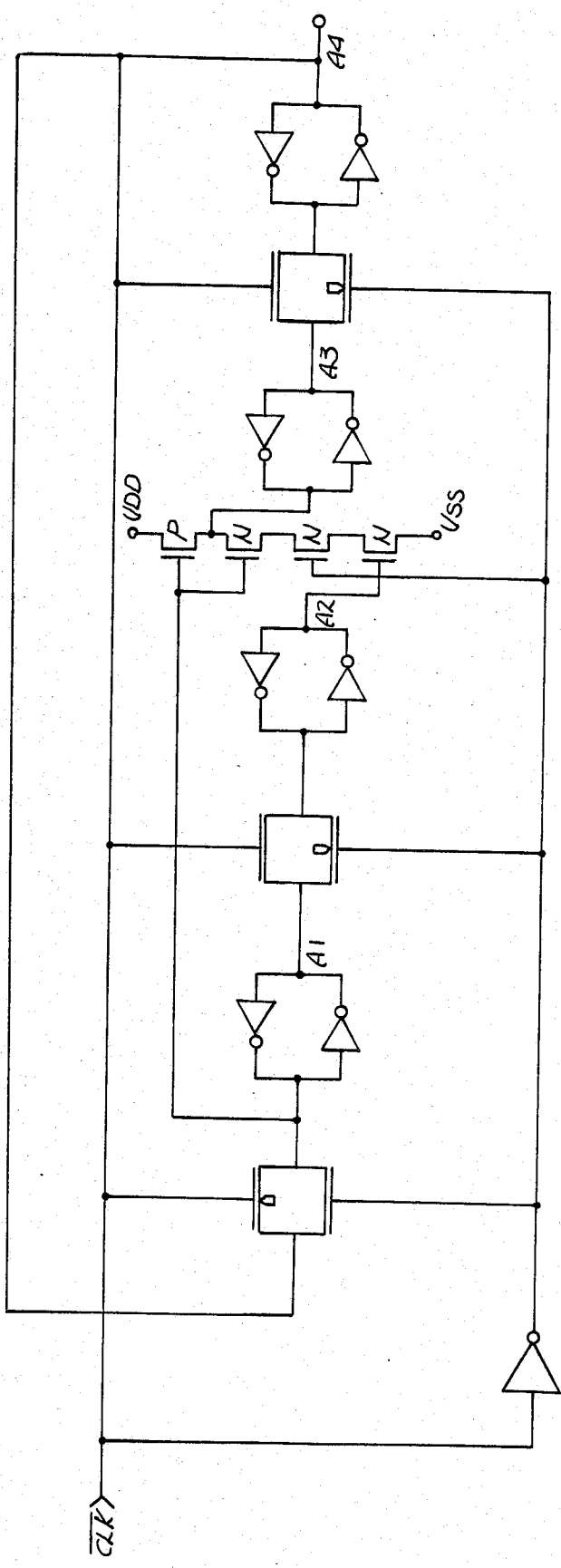
FIG. 1 is a schematic diagram of a prior art divide-by-three CMOS counter, employing an overdriven latch architecture.

FIG. 1 shows a prior art implementation of a divide-by-three counter employing an overdriven latch architecture. During each three cycles of the clock signal CLK, the following outputs are generated at nodes A1, A2, A3, and A4:

| CLK | A1 | A2 | A3 | A4 |
|-----|----|----|----|----|
| 1 | 1 | 0 | 0 | 1 |
| 0 | 0 | 0 | 0 | 1 |
| 1 | 0 | 1 | 0 | 1 |
| 0 | 0 | 1 | 1 | 1 |
| 1 | 0 | 1 | 1 | 0 |
| 0 | 1 | 1 | 0 | 0 |
| 1 | 1 | 0 | 0 | 1 |
| 0 | 0 | 0 | 0 | 1 |

The count sequence of this prior art device is not a standard binary sequence, but rather a unique code. In some uses, decoding this code to a 7-segment code is simpler than decoding a conventional sequential binary code. Thus, additional layout savings in other areas of an integrated circuit may be achieved by using a circuit that implements the above code.

Figure 2:
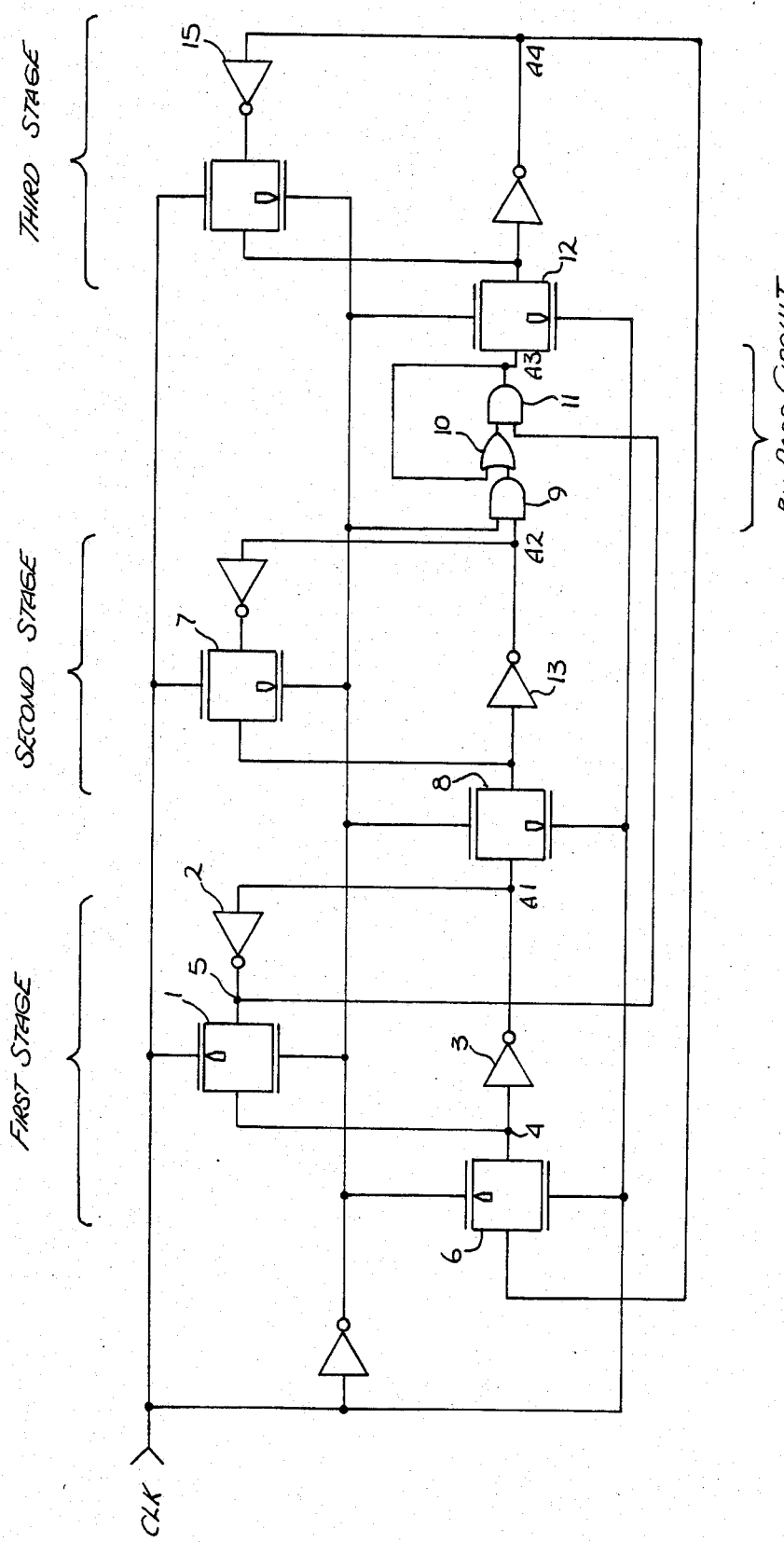
FIG. 2 is a schematic diagram of the preferred embodiment of a divide-by-three counter made in accordance with the switched-latch architecture of the present invention.

FIG. 2 shows the preferred embodiment of a divide-by-three counter designed in accordance with the present invention. Shown is the schematic of a CMOS FET implementation using standard logic gates (inverters, OR gates, and AND gates), as well as transmission gates. Such transmission gates permit the passage of a signal when activated by a control or gating signal, and block the passage of a signal when not activated. The logical effect of a transmission gate is similar to an AND gate. However, the propagation delay in a transmission gate is typically far less than that of a standard AND gate. This difference in propagation delay is usefully applied in the present invention.

The structure of the present invention is highly modular. The divide-by-three counter in FIG. 2 comprises three virtually identical stages, with each stage comprising a transmission gate and a static switched latch. The odd-counting property of the circuit is provided by a bypass circuit stage between the second and third stages.

Focusing on an individual stage in FIG. 2, each static switched latch comprises a transmission gate 1 and two inverters 2,3 connected in series as shown. At all times, the output of the latch at node A1 is the inverse of the input to inverter 3 at node 4. When the clock signal CLK is a logical "0", transmission gate 1 is deactivated and prevents the output of inverter 2 from being coupled to the input of inverter 3. When the clock signal CLK is a logical "1" in the next half cycle, transmission gate 1 is activated, thereby coupling the output of inverter 2 to the input of inverter 3. In this state, if no extraneous input signal is permitted to be coupled to the input of inverter 3, the input state to inverter 3 from the prior half clock cycle is temporarily stored in the latch circuit. Thus, during the first half of each clock cycle, when the clock signal CLK is a logical "0", the latch circuit is in an unlatched state, meaning that the output at node A1 is the inverse of, but otherwise follows, the logic state at the input node 4. During the opposite clock phase, when the clock signal CLK is a logical "1", the last input state to inverter 3 is latched into the circuit if no extraneous input is coupled to inverter 3.

By adding a transmission gate 6 before each such latch, the input signal to inverter 3 can be controlled by synchronizing it with the clock signal CLK, thus providing a means to prevent extraneous inputs to inverter 3.

To illustrate the function of a single stage static switched-latch, assume that the input to transmission gate 6 is a logical "1", and that the clock signal CLK is a logical "0". Transmission gate 6 is thus active, and a logical "1" is applied to the input of inverter 3, causing node A1 to have a value of logical "0". Node 5, as the output of inverter 2, will have a value of logical "1". During the next half clock cycle, when the clock signal CLK has a value of logical "1", no further extraneous input to inverter 3 is permitted because transmission gate 6 is inactive. Transmission gate 1, however, is active, and the output of inverter 2 is transmitted to the input of inverter 3. In the present example, node A1 will retain the value of logical "0" during this half of the clock cycle. Thus, the inverse of the original input to transmission gate 6 has been latched into the circuit.

A latch stage can also be implemented by reversing the polarity of the transmission gates 1, 6 shown in the first stage. Such a reversal is shown in the second stage, where transmission gates 7 and 8 (corresponding to transmission gates 1 and 6, respectively, from the first stage) are activated on opposite clock phases in comparison to transmission gates 1 and 6 of the first stage.

A divide-by-three counter can be implemented as shown in FIG. 2 by concatenating stages, each comprising a transmission gate and a latch circuit. In any odd number counter implemented in accordance with this invention, a special bypass circuit must be added, which in effect acts as another "stage". The bypass circuit is shown in FIG. 2 as a first AND gate 9 coupled to the inverse of the clock signal CLK and to the output of the second stage at node A2, an OR gate 10 coupled to the output of AND gate 9 and to node A3, and a second AND gate 11 coupled to the output of OR gate 10 and the output of inverter 2. The output of the bypass circuit at node A3 serves as the input to transmission gate 12 of the last stage.

In operation, the divide-by-three circuit shown in FIG. 2 provides the same count sequence as the prior art counter shown in FIG. 1.

The divide-by-three circuit of FIG. 2 can be expanded to divide by other odd numbers. For example, a divide-by-five counter can be implemented by adding two stages identical to the first and second stages in FIG. 2 to the divide-by-three circuit, such that node A4 serves as the input to the added two stages, while the output of the second of the added two stages serves as the feedback path to transmission gate 6 of the first stage. In this configuration, the following count sequence will be achieved:

| CLK | A1 | A2 | A3 | A4 | A5 | A6 |
|-----|----|----|----|----|----|----|
| 1 | 1 | 0 | 0 | 1 | 0 | 1 |
| 0 | 0 | 0 | 0 | 1 | 0 | 1 |
| 1 | 0 | 1 | 0 | 1 | 0 | 1 |
| 0 | 0 | 1 | 1 | 1 | 0 | 1 |
| 1 | 0 | 1 | 1 | 0 | 0 | 1 |
| 0 | 0 | 1 | 1 | 0 | 1 | 1 |
| 1 | 0 | 1 | 1 | 0 | 1 | 0 |
| 0 | 1 | 1 | 0 | 0 | 1 | 0 |
| 1 | 1 | 0 | 0 | 1 | 1 | 0 |
| 0 | 1 | 0 | 0 | 1 | 0 | 0 |
| 1 | 1 | 0 | 0 | 1 | 0 | 1 |
| 0 | 0 | 0 | 0 | 1 | 0 | 1 |

It may be noted that the wave form output at node A6 is not symmetrical for a complete divide-by-five cycle. That is, node A6 is a logical "1" for three clock cycles, then a logical "0" for two clock cycles. This can be explained by the fact that data propagating through the latches on the first three clock cycles passes through all six latches, while on the next two clock cycles two latches are bypassed by the bypass circuit. This results in the data signal propagating through only four latches. Conceptually, the circuit alternates between divide-by-four and divide-by-six modes, resulting on average in a divide-by-five. Similarly, the basic divide-by-three circuit shown in FIG. 2 is also asymetric. However, this fact presents no disadvantage to the present invention, since the transition of the last node from a logical "0" to a logical "1" can easily be detected by conventional edge-triggered circuitry.

Additional inputs may be provided to the divide-by-three circuit shown in FIG. 2 to provide a reset capability. For example, inverters 2, 13, and 15 in FIG. 2 may be replaced by NOR gates coupled to a reset signal. When the reset signal is a logical "1", the output of the NOR gates will be forced to a logical "0" state. When the reset signal is a logical "0", the NOR gates will act simply as inverters, functioning identically to inverters 2, 13, and 15.

If an even-number divider is desired, then the circuit in FIG. 2 would be modified somewhat so that the output signal at node A2 is inverted and then directly connected to the input of transmission gate 6. In such a configuration, the circuit would have the following count sequence:

| CLK | A1 | A2 |
|---|---|---|
| 1 | 1 | 0 |
| 0 | 0 | 0 |
| 1 | 0 | 1 |
| 0 | 1 | 1 |
| 1 | 1 | 0 |
| 0 | 0 | 0 |

From the above truth table, it can be seen that this circuit, as modified, is a divide-by-two counter, with output A2 returning to its original state every two clock cycles.

The present invention can be used as a divide-by-N counter, where N is any even number, by concatenating additional pairs of stages to the end of the first two stages shown in FIG. 2, and feeding the inverted output of the last stage as an input to transmission gate 6. Thus, a divide-by-four circuit comprises four stages, with the last two stages being identical in configuration and polarity to the first two stages. A divide-by-six counter would comprise six stages. Additional pairs of stages can be added in a similar manner to produce other even-number divider circuits.

While this invention has been described with reference to a preferred embodiment, it is not intended that this description be construed in a limiting sense. For example, the inventive circuit may be implemented in PMOS or NMOS technology rather than in CMOS technology. Various other modifications of the preferred embodiment, as well as other embodiments of the invention, will be apparent to persons skilled in the art upon reference to this description. It is therefore contemplated that the appended claims will cover any modifications or embodiments as fall within the true scope of the invention.

I claim:

1. An electronic static switched-latch odd frequency divider circuit comprising:

(a) a first stage comprising a first transmission gate coupled to and controlled by a clock signal, said first transmission gate having an input and an output and transmitting signals therethrough when said clock signal has a first level, and a first switched-latch means coupled to the output of the first transmission gate, the input of said first transmission gate providing the input of said first stage and the output of said first switched latch means providing the output of said first stage;

(b) a second stage comprising a second transmission gate coupled to and controlled by said clock signal, said second transmission gate having an input and an output and transmitting signals therethrough when said clock signal has a second level, and a second switched-latch means coupled to the output of the second transmission gate, the input of said second transmission gate providing the input of said second stage and the output of said second switched-latch means providing the output of said second stage the input of the second stage being coupled to the output of the first stage;

(c) bypass circuit means coupled to the output of the second stage for selectively inverting the output of the second stage in a manner which alternates between two even frequency divider modes resulting on average in the desired odd division; and (d) a third stage comprising a third transmission gate coupled to and controlled by said clock signal, said third transmission gate having an input and an output and transmitting signals therethrough when said clock signal has said second level, and a third switched-latch means coupled to the output of the third transmission gate, the input of said third transmission gate providing the input of said third stage and the output of said third switched-latch means providing the output of said third stage the input of the third stage being coupled to the output of the bypass circuit means, and the output of the third stage being coupled to the input of the first stage.

2. The divider circuit of claim 1 wherein each switched-latch means comprises:

(a) a first inverter, wherein the input and output of the first inverter serves as the input and output of the switched-latch means;

(b) a second inverter, the input of which is coupled to the output of the first inverter; and (c) transmission gate means, the input of which is coupled to the output of the second inverter, the output of which is coupled to the input of the first inverter, and which is coupled to and controlled by said clock signal, for selectively coupling the output of the second inverter to the input of the first inverter.

3. The odd frequency divider circuit of claim 1 further comprising at least one additional pair of stages connected between said second stage and said bypass circuit means, each of said additional pairs of stages including a stage identical to said first stage and a stage identical to said second stage, whereby division by any odd number may be obtained by adding the appropriate number of pairs of stages.

* * * * *